United States Patent
Aipperspach et al.

(10) Patent No.: US 6,737,685 B2
(45) Date of Patent: May 18, 2004

(54) COMPACT SRAM CELL LAYOUT FOR IMPLEMENTING ONE-PORT OR TWO-PORT OPERATION

(75) Inventors: Anthony Gus Aipperspach, Rochester, MN (US); Donald Wayne Plass, Pleasant Valley, NY (US)

(73) Assignee: International Business Machines Corporation, Armonk, NY (US)

( * ) Notice: Subject to any disclaimer, the term of this patent is extended or adjusted under 35 U.S.C. 154(b) by 185 days.

(21) Appl. No.: 10/045,755

(22) Filed: Jan. 11, 2002

(65) Prior Publication Data
US 2003/0133322 A1 Jul. 17, 2003

(51) Int. Cl.$^7$ ............................................ H01L 27/10
(52) U.S. Cl. ........................ 257/208; 257/211; 257/903
(58) Field of Search .................................. 257/202, 204, 257/206–208, 211, 903, 904, 369

(56) References Cited

U.S. PATENT DOCUMENTS

| | | | |
|---|---|---|---|
| 5,815,432 A | 9/1998 | Naffziger et al. | 365/154 |
| 5,930,163 A | 7/1999 | Hara et al. | 365/154 |
| 6,347,062 B2 * | 2/2002 | Nii et al. | 365/230.05 |
| 2002/0117722 A1 * | 8/2002 | Osada et al. | 257/379 |

* cited by examiner

Primary Examiner—Minh-Loan Tran
(74) Attorney, Agent, or Firm—Joan Pennington

(57) ABSTRACT

Compact static random access memory (SRAM) cell layouts are provided for implementing one-port and two-port operation. The SRAM cell layouts include a plurality of field effect transistors (FETs). The plurality of FETs defines a storage cell and a pair of wordline FETs coupled to the storage cell. Each of the plurality of FETs has a device structure extending in a single direction. The device structure of each of the plurality of FETs includes a diffusion layer, a polysilicon layer and first metal layer. A local interconnect connects the diffusion layer, the polysilicon layer and the first metal layer. Each of the pair of wordline FETs having a gate input connected to a wordline. The wordline including a single wordline for implementing one-port operation or two separate wordline connections for implementing two-port operation. The local interconnect includes a metal local interconnect that lays on the diffusion and polysilicon layers for electrically connecting diffusion and polysilicon layers and a metal contact that extends between the metal local interconnect and the first level metal for electrically connecting diffusion and polysilicon layers and the first level metal. Alternatively, a metal contact lays directly on the diffusion and polysilicon layers electrically connecting diffusion and polysilicon layers and the first level metal. The local interconnect further includes a conduction layer disposed on a butted diffusion connection of diffusion-p type and diffusion-n type and a metal local interconnect disposed on the conduction layer.

16 Claims, 9 Drawing Sheets

PRIOR ART

PRIOR ART

US 6,737,685 B2

1

COMPACT SRAM CELL LAYOUT FOR IMPLEMENTING ONE-PORT OR TWO-PORT OPERATION

FIELD OF THE INVENTION

The present invention relates to complementary metal oxide semiconductor (CMOS) compact static random access memory (SRAM) cell layouts for implementing one-port and two-port operation.

DESCRIPTION OF THE RELATED ART

FIG. 1 illustrates a conventional six-device SRAM cell including a single word line. The prior art six-device SRAM cell includes four N-channel field effect transistors (NFETs) N1, N2, N3, N4 and two P-channel field effect transistors (PFETs) P5, P6. SRAM storage cell includes a pair of inverters formed by PFET P5 and NFET N2 and PFET P6 and NFET N3 that operate together in a loop to store a bit value. PFET P5 and NFET N2 and PFET P6 and NFET N3 are respectively connected between a voltage supply rail VDD and ground GND. The true bitline BLT is connected by NFET N1 to the drain and source connection of PFET P5 and NFET N2 and to the gate input to the inverter PFET P6 and NFET N3 at net C. The compliment bitline BLC is connected by NFET N4 to the drain and source connection of PFET P6 and NFET N3 and to the gate input to the inverter PFET P5 and NFET N2 at net T. The WORDLINE provides the gate input to wordline NFETs N1 and N4. The WORDLINE is activated, turning on wordline NFETs N1 and N4, to perform a read or write operation.

FIG. 2 illustrates another six-device SRAM cell with the wordline connection separated into two wordlines WORDLINE 0, WORDLINE 1, enabling separated single ended read operations to be performed with a conventional six-device SRAM cell.

For example, U.S. Pat. No. 5,815,432 discloses a single-ended read, dual-ended write dual port SRAM cell.

FIGS. 3A and 3B generally illustrate not shown to scale a prior art cell layout for the six-device SRAM cell of FIG. 1. Each of the SRAM devices NFETs N1, N2, N3, N4 and PFETs P5, P6 is respectively indicated within a solid line box. First level metal is indicated by M1, diffusion is indicated by RX and polysilicon is indicated by PC. A metal local interconnect is indicated by MC. A metal contact that extends between the first level metal M1 and local interconnect MC is indicated by CA.

In FIG. 3A, the true and compliment bitlines BLT, BLC are indicated respectively within dashed lines at the top of the SRAM cell, as shown in FIG. 3A. Voltage supply rail VDD and ground GND are indicated respectively near the bottom and center of the SRAM cell. Storage cell nets C and T are generally indicated. Wordline FETs N1 and N4 respectively are formed below the true and compliment bitlines BLT, BLC and share a common polysilicon PC WORDLINE connection. NFETs N2 and N3 are formed near the middle of the SRAM cell and PFETs P5 and P6 are formed below NFETs N2 and N3 closer to the bottom of the SRAM cell. NFET N2 and PFET P5 share a common polysilicon (PC) connection. NFET N3 and PFET P6 share a common polysilicon (PC) connection. Both wordline NFETs N1 and N4 are formed having width extending in a horizontal or X direction and length extending in a vertical or Y direction, as shown in the orientation of FIG. 3A. NFETs N2 and N3 and PFETs P5 and P6 are not formed in the same direction as the wordline NFETs N1 and N4. NFETs N2 and N3 and PFETs

2

P5 and P6 have a width extending in the vertical or Y direction and length extending in the horizontal or X direction. Wordline NFETs N1 and N4 are oriented 90° offset from the rest of the devices NFETs N2 and N3 and PFETs P5 and P6. In FIG. 3B, the first and second level metals M1, M2 are separately shown together with contacts CA.

A disadvantage of the prior art cell layout of FIGS. 3A and 3B for the six-device SRAM cell is the area required to form the SRAM cell. There are many applications where being able to have two read operations in a static random access memory (SRAM) is desirable. The prior art cell layout of FIGS. 3A and 3B is very difficult to arrange such that a two-port configuration is possible. For example, the overhead for adding an additional port to the traditional SRAM cell as illustrated in FIGS. 3A and 3B typically doubles the cell area. Another disadvantage of the prior art cell layout of FIGS. 3A and 3B is that the all the devices NFETs N1, N2, N3, N4 and PFETs P5, P6 do not extend in the same direction. As a result, device matching is more difficult.

U.S. Pat. No. 5,930,163 discloses an SRAM cell including P-well and N-well regions where inverters constituting an SRAM cell are formed. The P-well region is divided into two parts, which are laid out on the two sides of the N-well region. Boundaries (BL11, BL12) are formed to run parallel to bit lines (BL, /BL). With this layout, diffusion layers (ND1, ND2) within the P-well regions can be formed into simple shapes free from any bent portion, reducing the cell area. In this layout all the cell devices extend in the same direction. However, this layout is limited by a minimum required contact-to-contact spacing between contacts.

Referring also to FIG. 6A, a prior art interconnect structure of a six-device SRAM cell including a first metal layer METAL 1, and a pair of contacts CA with one contact CA connecting the first metal layer METAL 1 to a diffusion RX layer and another contact CA connecting the first metal layer METAL 1 to a polysilicon PC layer. An arrow labeled D indicates a minimum required contact-to-contact spacing between contacts. This required contact-to-contact spacing D limits how closely devices can be provided in the SRAM cell layout of U.S. Pat. No. 5,930,163.

A need exists for compact SRAM cell layouts for implementing one-port and two-port operation. It is also desirable that all the devices NFETs N1, N2, N3, N4 and PFETs P5, P6 extend in the same direction to insure effective device matching.

SUMMARY OF THE INVENTION

Principal objects of the present invention are to provide compact SRAM cell layouts for implementing one-port and two-port operation. Other important objects of the present invention are to provide such compact SRAM cell layouts that effectively insure device matching with all SRAM devices extending in the same direction; and to provide such compact SRAM cell layouts substantially without negative effect and that overcome many of the disadvantages of prior art arrangements.

In brief, compact static random access memory (SRAM) cell layouts are provided for implementing one-port and two-port operation. The SRAM cell layouts include a plurality of field effect transistors (FETs). The plurality of FETs defines a storage cell and a pair of wordline FETs coupled to the storage cell. Each of the plurality of FETs has a device structure extending in a single direction. The device structure of each of the plurality of FETs includes a diffusion layer, a polysilicon layer and first metal layer. A local interconnect connects the diffusion layer, the polysilicon layer and the first metal layer. Each of the pair of wordline FETs having a gate input connected to a wordline. The wordline including a single wordline for implementing one-port operation or two separate wordline connections for implementing two-port operation.

In accordance with features of the invention, the local interconnect includes a metal local interconnect that lays on the diffusion and polysilicon layers for electrically connecting diffusion and polysilicon layers and a metal contact that extends between the metal local interconnect and the first level metal for electrically connecting diffusion and polysilicon layers and the first level metal. Alternatively, a metal contact lays on the diffusion and polysilicon layers for electrically connecting diffusion and polysilicon layers and the first level metal. The local interconnect further includes a conduction layer disposed on a butted diffusion connection of diffusion-p type and diffusion-n type and a metal local interconnect disposed on the conduction layer.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

Figure 1:
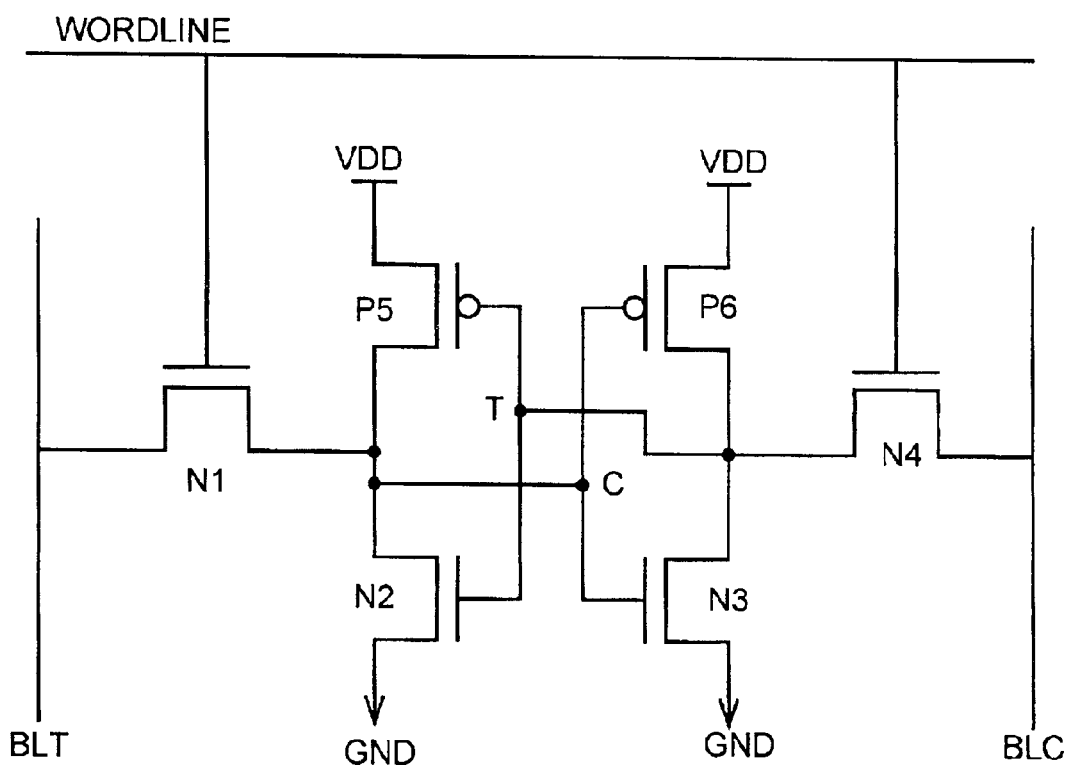
FIG. 1 is a schematic diagram illustrating a prior art six-device SRAM cell.
Figure 4A:
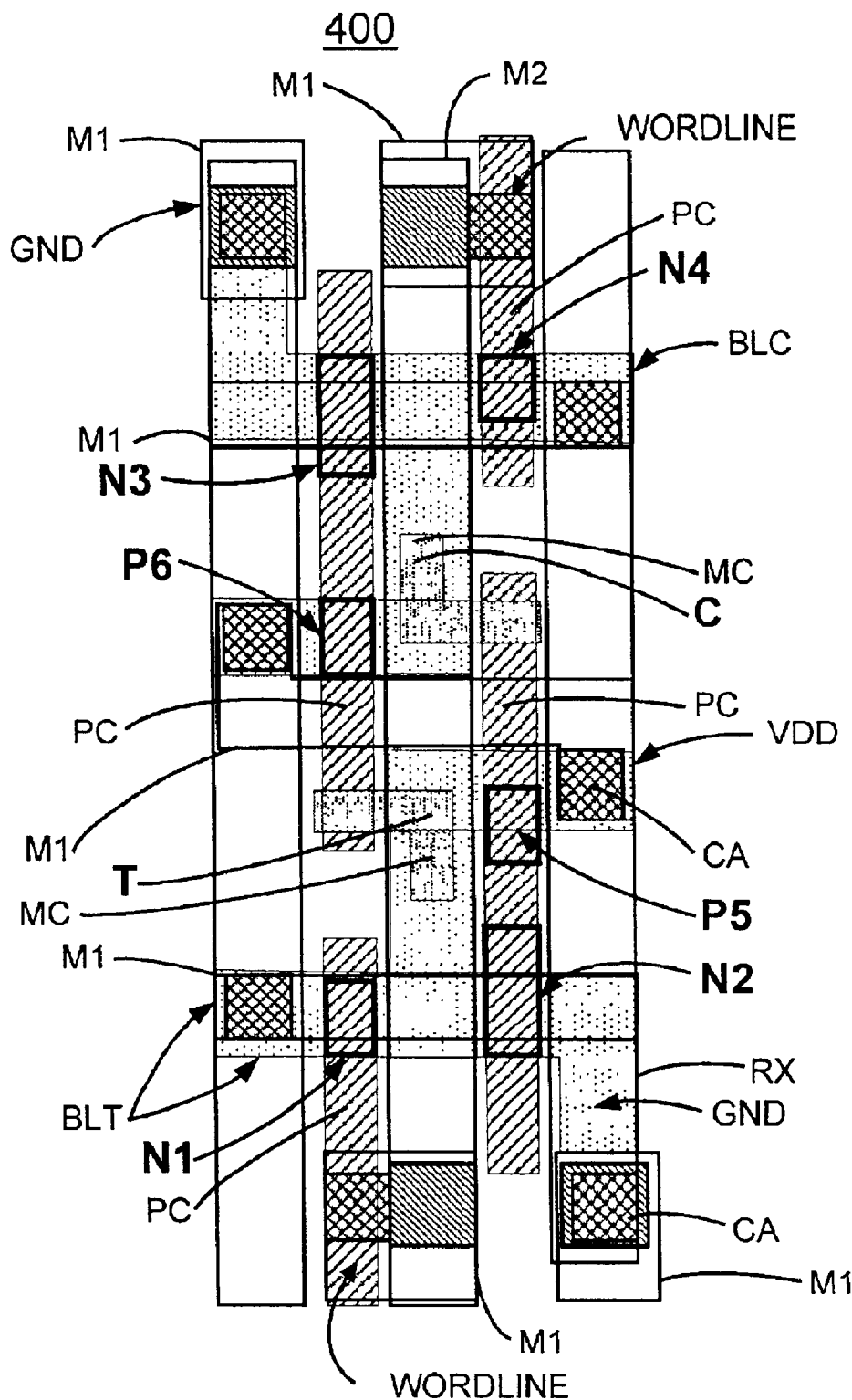
FIGS. 4A and 4B are diagrams illustrating a cell layout in accordance with the preferred embodiment for the six-device SRAM cell of FIG. 1.
Figure 4B:
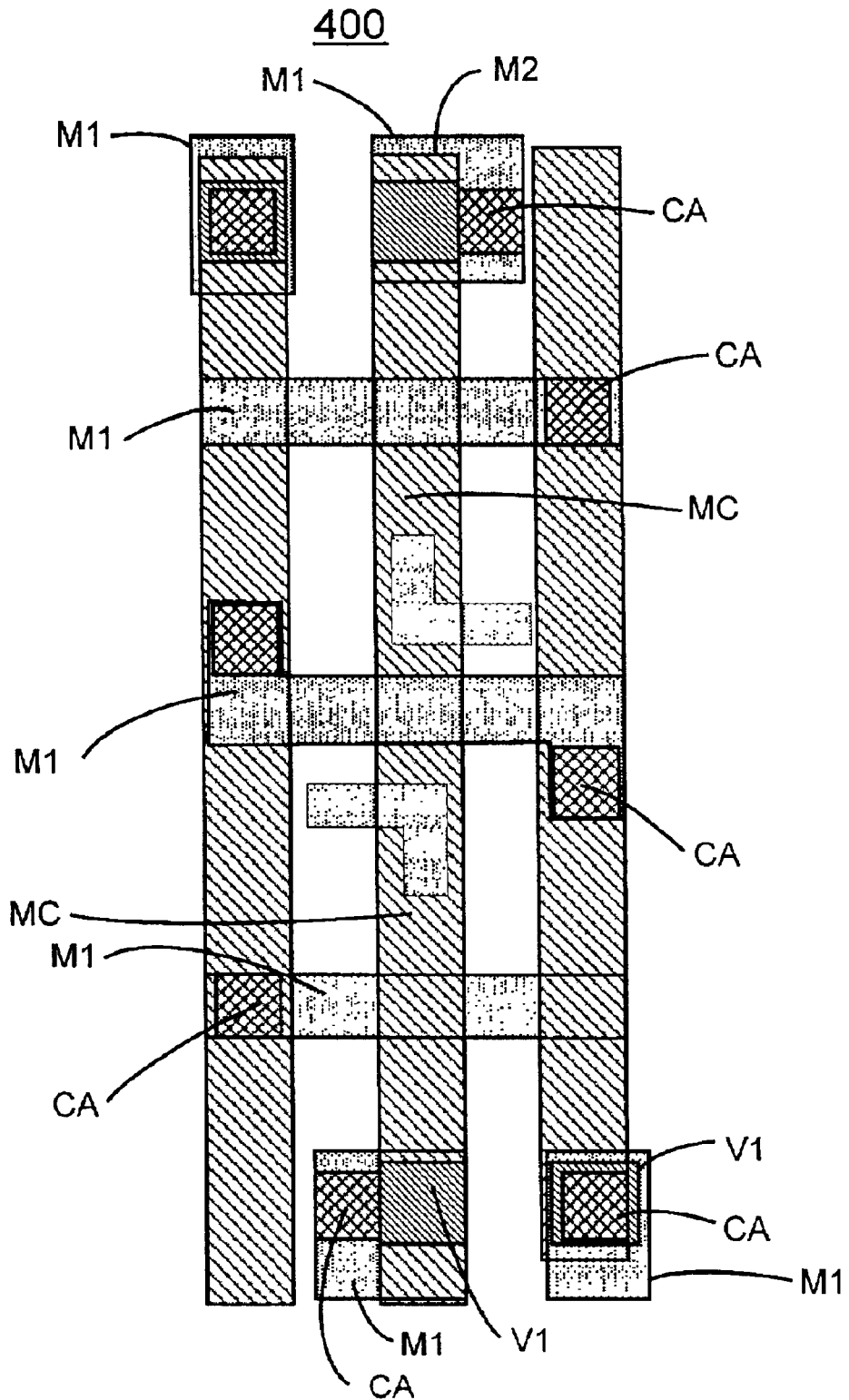

Having reference now to the drawings, FIGS. 4A and 4B generally illustrate not shown to scale a cell layout in accordance with the preferred embodiment for the six-device SRAM cell of FIG. 1 generally designated by the reference character 400.

Figure 3A:
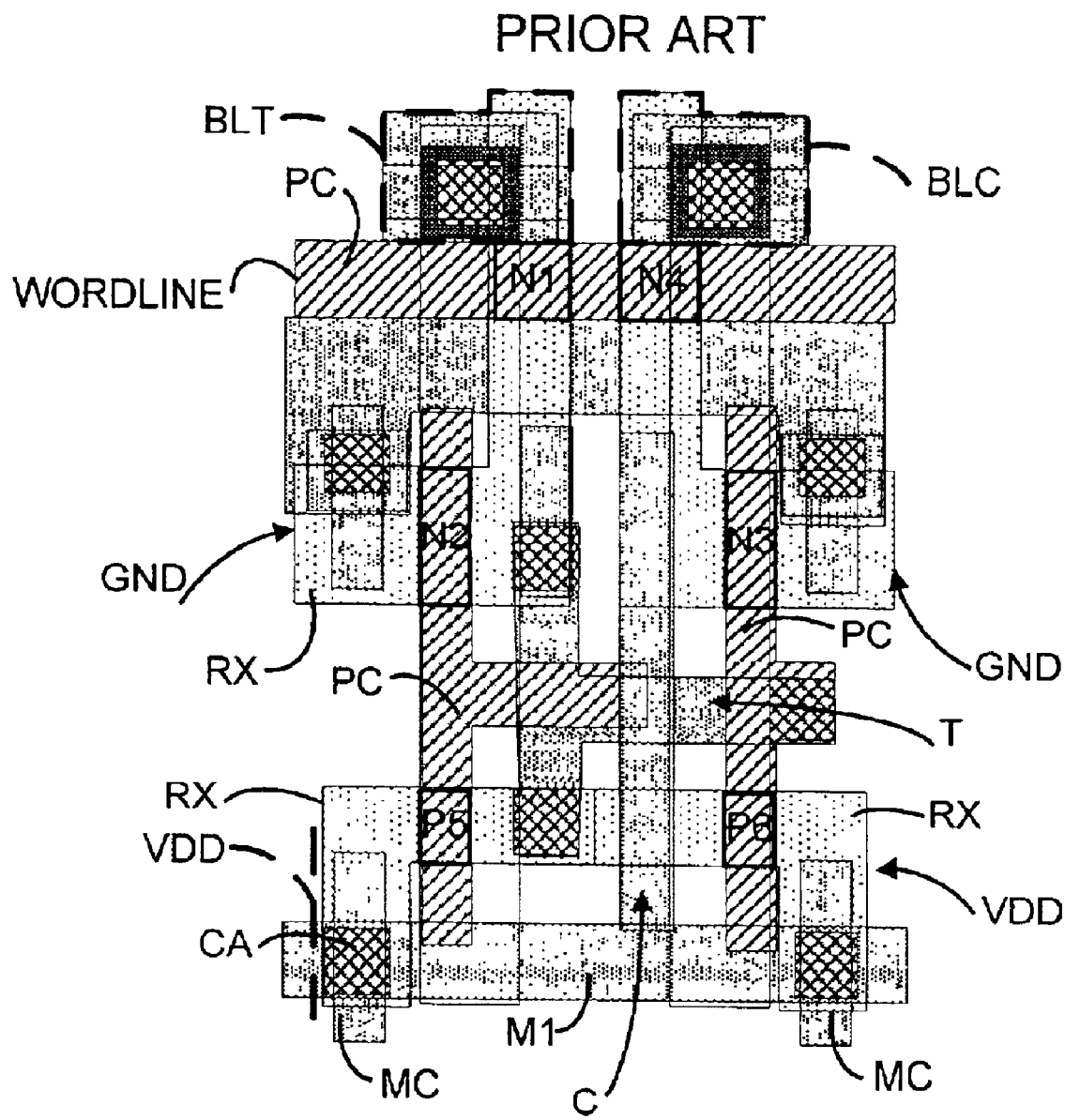
FIGS. 3A and 3B are diagrams illustrating a prior art cell layout for the six-device SRAM cell of FIG. 1.
Figure 3B:
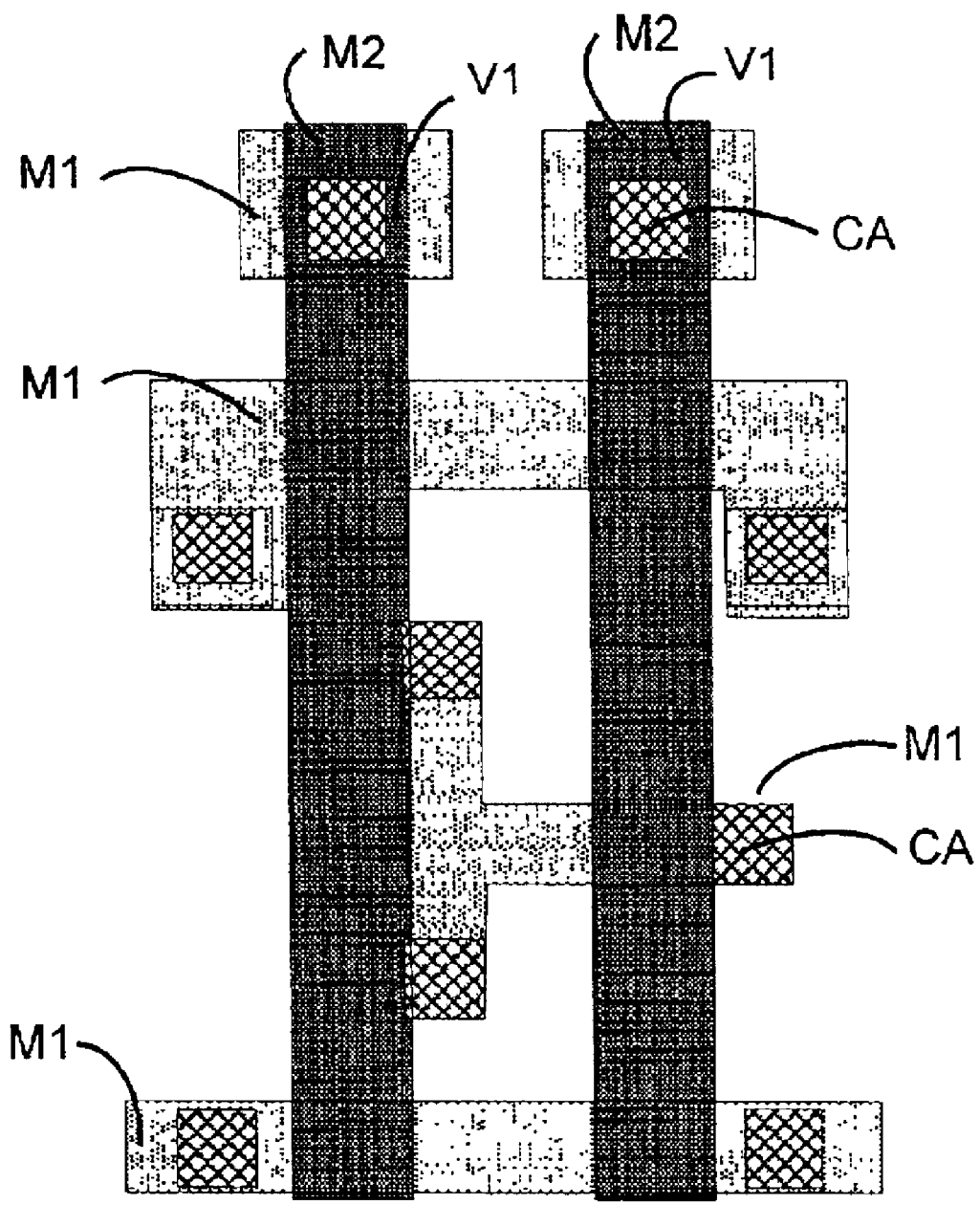
Figure 6A:
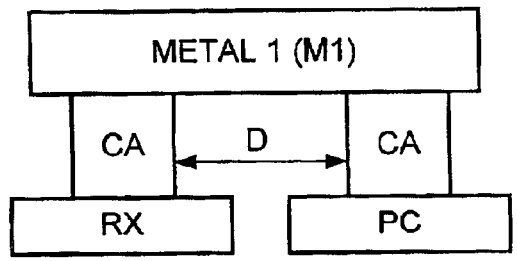
FIG. 6A is a diagram illustrating a prior art interconnect structure of a six-device SRAM cell.

In accordance with features of the invention, compact SRAM cell layout 400 for implementing one-port operation effectively insures device matching with all SRAM devices extending in the same direction. The SRAM cell layout 400 provides superior density as compared to prior art arrangements. SRAM cell layout 400 uses, for example, approximately 15% less area than the prior art cell layout of FIGS. 3A and 3B for the six-device SRAM cell. SRAM cell layout 400 utilizes local interconnect (MC) technology 600 as illustrated and described with respect to FIG. 6B so that device spacing is not limited by the required contact-to-contact spacing D of the prior art non-local interconnect technology as illustrated in FIG. 6A.

As shown in FIGS. 4A and 4B, each of the SRAM devices NFETs N1, N2, N3, N4 and PFETs P5, P6 is respectively indicated within a solid line box. Each of the SRAM devices NFETs N1, N2, N3, N4 and PFETs P5, P6 extend in the same direction with a width extending in the vertical or Y direction and length extending in the horizontal or X direction.

Figure 6B:
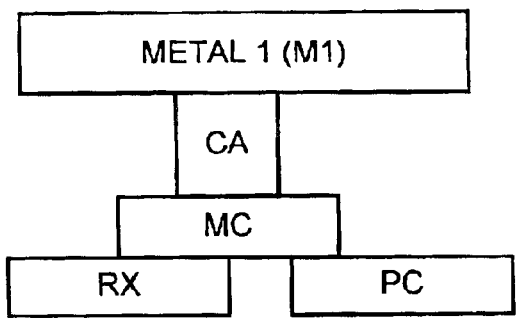
FIGS. 6B, 6C, and 6D are diagrams illustrating interconnect structures of the six-device SRAM cell in accordance with the preferred embodiment.

Referring also to FIG. 6B, a first level metal is indicated by M1, diffusion is indicated by RX and polysilicon is indicated by PC. A metal local interconnect is indicated by MC that lays on the diffusion RX and polysilicon PC layers is used for electrically connecting diffusion RX and polysilicon PC layers. A metal contact is indicated by CA that extends between the first level metal M1 and local interconnect MC.

In FIG. 4B, the first and second level metals M1, M2 are separately shown together with metal contact CA, and via designated V1 from the first level metal M1 to the second level metal M2. In FIG. 4A first and second level metals M1, M2 are shown without shading so that details of other layers of the SRAM cell layout 400 can be seen.

As shown in the orientation of SRAM cell layout 400 in FIGS. 4A and 4B, rotated mirror-image true and compliment bitlines BLT, BLC are indicated respectively with wordline NFETs N1 and N4 near the bottom and top of the SRAM cell 400. Similarly, first level metal M1, voltage supply rail VDD is indicated at the center of the SRAM cell and diffusion RX layer, ground GND are indicated near the bottom and top of the SRAM cell. Wordline FETs N1 and N4 respectively are formed with a respective gate connected to a respective polysilicon PC, WORDLINE connection indicated near the bottom and top of the SRAM cell. NFETs N2 and N3 are formed near the bottom and top of the SRAM cell 400 near the wordline FETs N1 and N4. PFETs P5 and P6 are generally centrally formed within the SRAM cell layout 400 respectively aligned with NFETs N2 and N3. NFET N2 and PFET P5 share a common polysilicon PC gate connection. NFET N3 and PFET P6 share a common polysilicon PC gate connection. Storage cell net T is indicated by T including a generally L-shaped local interconnect MC overlaying the common polysilicon PC gate connection of NFET N2 and PFET P5 and overlaying the source connection of NFET N3 and PFET P6. Net C is indicated by C including another rotated mirror-image generally L-shaped local interconnect MC overlaying the common polysilicon PC gate connection of NFET N3 and PFET P6 and overlaying the source connection of NFET N2 and PFET P5.

Figure 2:
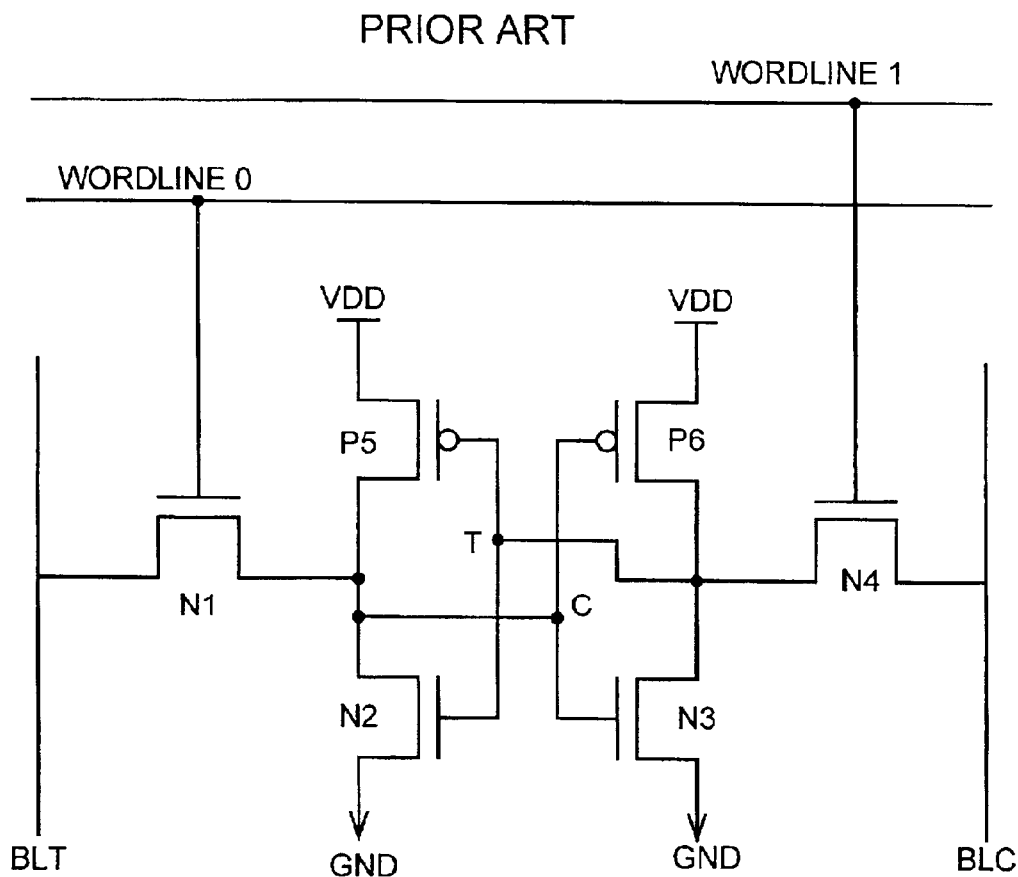
FIG. 2 is a schematic diagram illustrating a prior art six-device SRAM cell including dual wordlines enabling separated single ended read operations.
Figure 5A:
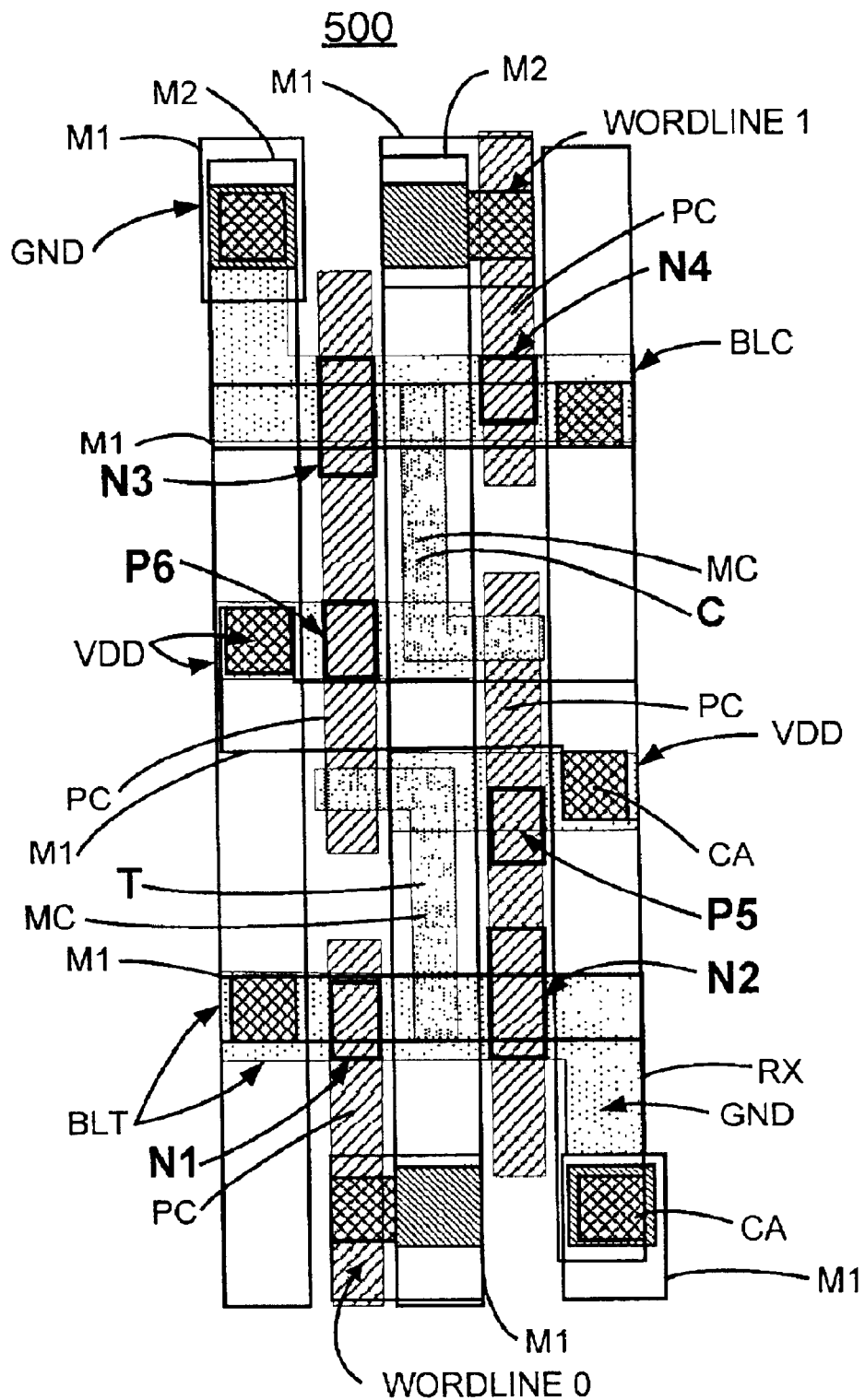
FIGS. 5A and 5B are diagrams illustrating a cell layout in accordance with the preferred embodiment for the six-device SRAM cell including dual wordlines of FIG. 2.
Figure 5B:
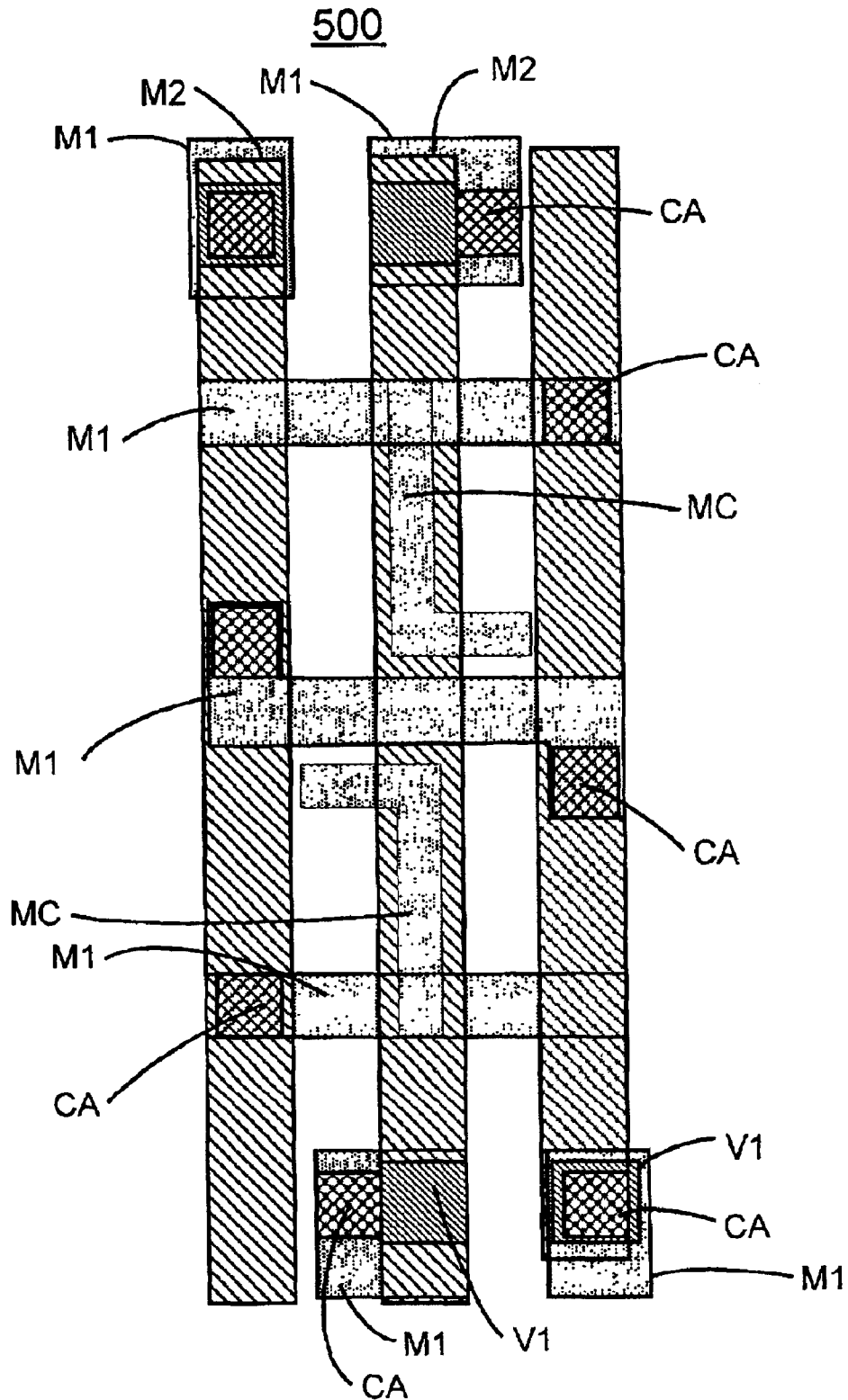

FIGS. 5A and 5B generally illustrate not shown to scale a cell layout in accordance with the preferred embodiment for the six-device SRAM cell of FIG. 2 generally designated by the reference character 500. The same designations as used for the six-device SRAM cell of FIG. 1 in FIGS. 4A and 4B are used for identical or similar components for the six-device SRAM cell of FIG. 2 in the SRAM cell layout 500 of FIGS. 5A and 5B.

In accordance with features of the invention, compact SRAM cell layout 500 for implementing two-port operation effectively insures device matching with all SRAM devices extending in the same direction. The SRAM cell layout 500 provides superior density as compared to prior art arrangements. SRAM cell layout 500 provides two-port operation with approximately 8% more area than the prior art cell layout of FIGS. 3A and 3B for the six-device SRAM cell that includes only a single wordline for one-port operation.

As shown in FIGS. 5A and 5B, each of the SRAM devices NFETs N1, N2, N3, N4 and PFETs P5, P6 is respectively indicated within a solid line box. Each of the SRAM devices NFETs N1, N2, N3, N4 and PFETs P5, P6 extend in the same direction with a width extending in the vertical or Y direction and length extending in the horizontal or X direction in the illustrated SRAM cell layout 500 of FIG. 5A.

In FIG. 5B, the first and second level metals M1, M2 are separately shown together with metal contact CA, and via designated V1 from the first level metal M1 to the second level metal M2. In FIG. 5A first and second level metals M1, M2 are shown without shading so that details of other layers of the SRAM cell layout 500 can be seen.

As shown in the orientation of SRAM cell layout 500 in FIGS. 5A and 5B, rotated mirror-image true and compliment bitlines BLT, BLC are indicated respectively with wordline NFETs N1 and N4 near the bottom and top of the SRAM cell 500. Similarly, first level metal M1, voltage supply rail VDD is indicated at the center of the SRAM cell and diffusion RX layer, ground GND are indicated near the bottom and top of the SRAM cell.

SRAM cell layout 500 includes two wordlines WORD-LINE 0, WORDLINE 1, enabling separated single ended read operations to be performed with the six-device SRAM cell. WORDLINE 0 includes a polysilicon PC gate connection to wordline FET N1 indicated near the bottom the SRAM cell layout in FIG. 5A. WORDLINE 1 includes a polysilicon PC gate connection to wordline FET N4 indicated near the top the SRAM cell layout in FIG. 5A.

NFETs N2 and N3 are respectively formed near the bottom and top of the SRAM cell 500 near the wordline FETs N1 and N4. PFETs P5 and P6 are generally centrally formed within the SRAM cell layout 500 respectively aligned with NFETs N2 and N3. NFET N2 and PFET P5 share a common polysilicon PC gate connection. NFET N3 and PFET P6 share a common polysilicon PC gate connection. Storage cell net T is indicated by T including a generally L-shaped local interconnect MC overlaying the common polysilicon PC gate connection of NFET N2 and PFET P5. Net C is indicated by C including another rotated mirror-image generally L-shaped local interconnect MC overlaying the common polysilicon PC gate connection of NFET N3 and PFET P6.

Figure 6C:
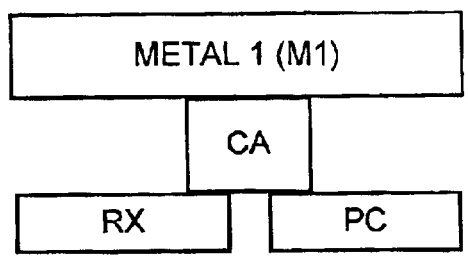

Referring to FIG. 6C, another local interconnect technology 610 is illustrated for use in a SRAM cell layout in accordance with the preferred embodiment. In FIG. 6C, a first level metal is indicated by M1, diffusion is indicated by RX and polysilicon is indicated by PC. A metal local interconnect MC as shown in the local interconnect technology 610 is not used. Local interconnect 610 uses the metal contact CA that lays on the diffusion RX and polysilicon PC layers for electrically connecting diffusion RX and polysilicon PC layers and the first level metal M1.

Figure 6D:
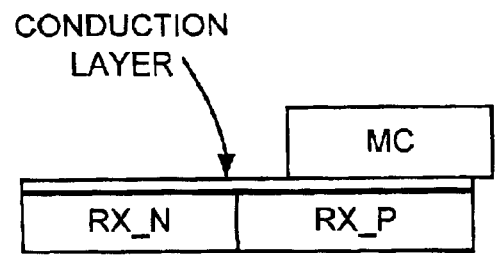

Referring to FIG. 6D, another local interconnect technology 620 is illustrated for use in a SRAM cell layout in accordance with the preferred embodiment. In FIG. 6D, a butted diffusion connection is shown including diffusion layers RX_N and RX_P that are butted together. A conduction layer lays on the diffusion layers RX_N and RX_P electrically connecting the RX_N and RX_P. A metal local interconnect MC lays on the conduction layer.

Both local interconnect technologies 600 of FIG. 6B, 610 of FIG. 6C, and 620 of FIG. 6D facilitate reduced area for a SRAM cell layout in accordance with the preferred embodiment as compared to the prior art non-local interconnect technology of FIG. 6A. The required contact-to-contact spacing D of the prior art non-local interconnect technology of FIG. 6A does not limit how closely devices can be provided with the local interconnect technologies 600 of FIG. 6B, 610 of FIG. 6C, and 620 of FIG. 6D.

While the present invention has been described with reference to the details of the embodiments of the invention shown in the drawing, these details are not intended to limit the scope of the invention as claimed in the appended claims.

What is claimed is:

1. A compact static random access memory (SRAM) cell layout for implementing one-port or two-port operation comprising:

a plurality of field effect transistors (FETs); said plurality of FETs defining a storage cell and a pair of wordline FETs coupled to said storage cell; each of said plurality of FETs having a device structure extending in a single direction;

said device structure of each of said plurality of FETs including a diffusion layer, a polysilicon layer and first metal layer;

a local interconnect connecting said diffusion layer, said polysilicon layer and said first metal layer; said local interconnect including a metal local interconnect disposed on said diffusion and polysilicon layers for electrically connecting said diffusion and polysilicon layers and a metal contact extending between said metal local interconnect and said first level metal for electrically connecting said diffusion and polysilicon layers and said first level metal; and each of said pair of wordline FETs having a gate input connected to a wordline; said wordline including a single wordline for implementing one-port operation or two separate wordline connections for implementing two-port operation.

2. A compact static random access memory (SRAM) cell layout for implementing one-port or two-port operation as recited in claim 1 wherein each of said plurality of FETs having said device structure extending in said single direction include each of said plurality of FETs having a width extending in a first direction and length extending in a second direction; said first and second directions being offset by 90°.

3. A compact static random access memory (SRAM) cell layout for implementing one-port or two-port operation as recited in claim 1 wherein said plurality of FETs include a plurality of both N-channel field effect transistors (NFETs) and P-channel field effect transistors (PFETs).

4. A compact static random access memory (SRAM) cell layout for implementing one-port or two-port operation as recited in claim 3 wherein said storage cell includes a pair of inverters, each inverter formed by one PFET and one NFET connected between voltage supply rail and ground connections and having a common gate connection of said one PFET and one NFET connected to an output of said other one of said pair of inverters.

5. A compact static random access memory (SRAM) cell layout for implementing one-port or two-port operation as recited in claim 4 wherein said voltage supply rail and ground connections includes said first metal layer.

6. A compact static random access memory (SRAM) cell layout for implementing one-port or two-port operation as recited in claim 4 wherein said common gate connection of said one PFET and one NFET includes said polysilicon layer.

7. A compact static random access memory (SRAM) cell layout for implementing one-port or two-port operation comprising:

a plurality of field effect transistors (FETs); said plurality of FETs defining a storage cell and a pair of wordline FETs coupled to said storage cell; each of said plurality of FETs having a device structure extending in a single direction;

said device structure of each of said plurality of FETs including a diffusion layer, a polysilicon layer and first metal layer;

a local interconnect connecting said diffusion layer, said polysilicon layer and said first metal layer; said local interconnect including a metal contact disposed on said diffusion and polysilicon layers and extending to said first level metal for electrically connecting said diffusion and polysilicon layers and said first level metal; and each of said pair of wordline FETS having a gate input connected to a wordline; said wordline including a single wordline for implementing one-port operation or two separate wordline connections for implementing two-port operation.

8. A compact static random access memory (SRAM) cell layout for implementing one-port or two-port operation comprising:

a plurality of field effect transistors (FETs); said plurality of FETs defining a storage cell and a pair of wordline FETs coupled to said storage cell; each of said plurality of FETs having a device structure extending in a single direction;

said device structure of each of said plurality of FETs including a diffusion layer, a polysilicon layer and first metal layer;

a local interconnect connecting said diffusion layer, said polysilicon layer and said first metal layer; said local interconnect including a conduction layer disposed on a butted diffusion connection of diffusion-p type and diffusion-n type and a metal local interconnect disposed on said conduction layer; and each of said pair of wordline FETs having a gate input connected to a wordline; said wordline including a single wordline for implementing one-port operation or two separate wordline connections for implementing two-port operation.

9. A compact static random access memory (SRAM) cell layout for implementing one-port operation comprising:

a plurality of field effect transistors (FETs); said plurality of FETs defining a storage cell and a pair of wordline FETs coupled to said storage cell; each of said plurality of FETs having a device structure extending in a single direction;

said device structure of each of said plurality of FETs including a diffusion layer, a polysilicon layer and first metal layer;

a local interconnect connecting said diffusion layer, said polysilicon layer and said first metal layer; said local interconnect including a metal local interconnect disposed on said diffusion and polysilicon layers for electrically connecting said diffusion and polysilicon layers and a metal contact extending between said metal local interconnect and said first level metal for electrically connecting said diffusion and polysilicon layers and said first level metal; and each of said pair of wordline FETs having a gate input connected to a single wordline for implementing one-port operation.

10. A compact static random access memory (SRAM) cell layout for implementing one-port operation as recited in claim 9 wherein each of said plurality of FETs having said device structure extending in said single direction include a plurality of both N-channel field effect transistors (NFETs) and P-channel field effect transistors (PFETs) and each of said plurality of NFETs and PFETs having a width extending in a first direction and length extending in a second direction; said first and second directions being offset by 90°.

11. A compact static random access memory (SRAM) cell layout for implementing one-port operation as recited in claim 10 wherein said storage cell includes a pair of inverters, each inverter formed by one PFET and one NFET connected between voltage supply rail and ground connections and having a common gate connection of said one PFET and one NFET connected to an output of said other one of said pair of inverters.

12. A compact static random access memory (SRAM) cell layout for implementing one-port operation comprising:

a plurality of field effect transistors (FETs); said plurality of FETs defining a storage cell and a pair of wordline FETs coupled to said storage cell; each of said plurality of FETs having a device structure extending in a single direction;

said device structure of each of said plurality of FETs including a diffusion layer, a polysilicon layer and first metal layer;

a local interconnect connecting said diffusion layer, said polysilicon layer and said first metal layer; said local interconnect including a metal contact disposed on said diffusion and polysilicon layers and extending to said first level metal for electrically connecting said diffusion and polysilicon layers and said first level metal; and each of said pair of wordline FETs having a gate input connected to a single wordline for implementing one-port operation.

13. A compact static random access memory (SRAM) cell layout for implementing two-port operation comprising:

a plurality of field effect transistors (FETs); said plurality of FETs defining a storage cell and a pair of wordline FETs coupled to said storage cell; each of said plurality of FETs having a device structure extending in a single direction;

said device structure of each of said plurality of FETs including a diffusion layer, a polysilicon layer and first metal layer;

a local interconnect connecting said diffusion layer, said polysilicon layer and said first metal layer; said local interconnect including a metal local interconnect disposed on said diffusion and polysilicon layers for electrically connecting said diffusion and polysilicon layers and a metal contact extending between said metal local interconnect and said first level metal for electrically connecting said diffusion and polysilicon layers and said first level metal; and each of said pair of wordline FETs having a gate input connected to a respective wordline of two separate wordline connections for implementing two-port operation.

14. A compact static random access memory (SRAM) cell layout for implementing two-port operation as recited in claim 13 wherein each of said plurality of FETs having said device structure extending in said single direction include a plurality of both N-channel field effect transistors (NFETs) and P-channel field effect transistors (PFETs) and each of said plurality of NFETs and PFETs having a width extending in a first direction and length extending in a second direction; said first and second directions being offset by 90°.

15. A compact static random access memory (SRAM) cell layout for implementing two-port operation as recited in claim 14 wherein said storage cell includes a pair of inverters, each inverter formed by one PFET and one NFET connected between voltage supply rail and ground connections and having a common gate connection of said one PFET and one NFET connected to an output of said other one of said pair of inverters.

16. A compact static random access memory (SRAM) cell layout for implementing two-port operation comprising:

- a plurality of field effect transistors (FETs); said plurality of FETs defining a storage cell and a pair of wordline FETs coupled to said storage cell; each of said plurality of FETs having a device structure extending in a single direction;
- said device structure of each of said plurality of FETs including a diffusion layer, a polysilicon layer and first metal layer;
- a local interconnect connecting said diffusion layer, said polysilicon layer and said first metal layer; said local interconnect including a metal contact disposed on said diffusion and polysilicon layers and extending to said first level metal for electrically connecting said diffusion and polysilicon layers and said first level metal; and
- each of said pair of wordline FETs having a gate input connected to a respective wordline of two separate wordline connections for implementing two-port operation.

* * * * *